(12) United States Patent
Wu et al.

(10) Patent No.: US 8,664,661 B2
(45) Date of Patent: Mar. 4, 2014

(54) THIN FILM TRANSISTOR, METHOD OF FABRICATING THIN FILM TRANSISTOR AND PIXEL STRUCTURE

(71) Applicant: Au Optronics Corporation, Hsinchu (TW)

(72) Inventors: Huang-Chun Wu, Hsinchu (TW); Shine-Kai Tseng, Taoyuan County (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 13/916,593

(22) Filed: Jun. 13, 2013

(65) Prior Publication Data

US 2013/0270567 A1 Oct. 17, 2013

Related U.S. Application Data

(62) Division of application No. 12/881,178, filed on Sep. 14, 2010, now abandoned.

(30) Foreign Application Priority Data

Aug. 16, 2010 (TW) ................................ 99127301 A

(51) Int. Cl.
 *H01L 29/04* (2006.01)

(52) U.S. Cl.
 USPC ........... 257/59; 257/66; 257/57; 257/E27.133

(58) Field of Classification Search
 USPC .................. 257/57, 59, 66, E27.133
 See application file for complete search history.

(56) References Cited

U.S. PATENT DOCUMENTS

2007/0290205 A1* 12/2007 Chen et al. ...................... 257/59
2009/0262274 A1* 10/2009 Noda et al. ...................... 349/54

* cited by examiner

*Primary Examiner* — Dale E Page
(74) *Attorney, Agent, or Firm* — Jianq Chyun IP Office

(57) ABSTRACT

A method of fabricating a TFT includes providing a substrate where a gate, an insulating layer, and a channel layer are formed. A conductive layer is formed on the substrate to cover the channel layer and the insulating layer. A photoresist layer is formed on the conductive layer. A photo mask is placed above the photoresist layer and has a data line pattern, a source pattern, and a drain pattern. A first width (W1) between the source pattern and the drain pattern and a second width (W2) of the data line pattern satisfy the following: if W1−1(um), then W2+a(um), and 0.3<a<0.7. An exposing process is performed by using the photo mask, and a development process is performed to pattern the photoresist layer. The conductive layer is patterned by using the photoresist layer as an etching mask to form a source, a drain, and a data line.

6 Claims, 6 Drawing Sheets

THIN FILM TRANSISTOR, METHOD OF FABRICATING THIN FILM TRANSISTOR AND PIXEL STRUCTURE

CROSS-REFERENCE TO RELATED APPLICATION

This application is a divisional application of and claims the priority benefit of U.S. application Ser. No. 12/881,178, filed on Sep. 14, 2010, now pending, which claims the priority benefit of Taiwan application serial no. 99127301, filed on Aug. 16, 2010. The entirety of each of the above-mentioned patent applications is hereby incorporated by reference herein and made a part of specification.

BACKGROUND OF THE INVENTION

1. Field of the Invention

The invention relates to a thin film transistor (TFT), a method of fabricating a TFT, and a pixel structure.

2. Description of Related Art

The increasing progress of display technologies brings about great conveniences to people's daily lives. As such, flat panel displays (FPDs) featuring compactness become the main stream display products at present. Among various types of FPDs, liquid crystal displays (LCDs) have superb characteristics, such as high space utilization efficiency, low power consumption, no radiation, and low electromagnetic interference, so that the LCDs have been prevailing. TFTs are often applied to the displays, and therefore structures of the TFTs make a direct impact on performance of the products. Generally, a TFT at least includes a gate, a source, a drain, and a channel layer. Conductivity of the channel layer is determined by changing the voltage applied to the gate. Specifically, the source and the drain are electrically conducted with each other when the channel layer is turned on, and the source and the drain are electrically insulated from each other when the channel layer is turned off.

FIG. 1 is a schematic top view illustrating a conventional TFT. With reference to FIG. 1, the TFT normally has a gate G, a channel CH located above the gate G, and a source S and a drain D that are located above the channel CH. In such a TFT, the drain D extends from the source S. It can be learned from FIG. 1 that the drain D located above the channel CH/ the gate G (as marked by the reference number "10") has a line width different from a line width of the drain D extending away from the channel CH (as marked by the reference number "20"). This is mainly because the film profile affects critical dimension (CD) of photoresist patterns in an exposing process during fabrication of the TFT. That is to say, although the device patterns in the photo mask have the same line width, the photoresist layer is not exposed to the same degree in the exposing process, given the film layers below the photoresist layer have different heights and thus the thickness of the photoresist layer is changed. Thereby, the CD of the photoresist patterns may differ after the photoresist layer is patterned. Said difference leads to the issue of the drain D having different line widths as shown in FIG. 1.

If the CD of the photoresist patterns is excessively large, cross-talk effects are likely to occur in the devices. By contrast, if the CD of the photoresist patterns is overly small, the devices may encounter issues of excessive resistance value, broken lines, or short circuit. Accordingly, research and development are mainly geared towards the way to improve CD uniformity in the fabricating process of the TFT.

SUMMARY OF THE INVENTION

The invention is directed to a method of fabricating a TFT. The method is conducive to improvement of CD uniformity in the process of fabricating the TFT.

The invention is further directed to a TFT and a pixel structure having the TFT, and the TFT of the invention has a structure capable of preventing short circuit occurring in elements of the TFT.

The invention provides a method of fabricating a TFT. In the method, a substrate having a gate, an insulating layer, and a channel layer is provided. A conductive layer is formed on the substrate to cover the channel layer and the insulating layer. A photoresist layer is formed on the conductive layer. A photo mask is placed above the photoresist layer. The photo mask has a data line pattern, a source pattern, and a drain pattern. A first width (W1) is between the source pattern and the drain pattern, and the data line pattern has a second width (W2). The first width (W1) and the second width (W2) satisfy the following: if W1−1(um), then W2+a(um), and 0.3<a<0.7. An exposing process is performed with use of the photo mask, and a development process is performed, so as to pattern the photoresist layer. The conductive layer is patterned with use of the photoresist layer as an etching mask to form a source, a drain, and a data line.

The invention further provides a TFT electrically connected to a scan line. The TFT includes a gate, a channel layer, a source, and a drain. The source and the drain extend away from the scan line. A first distance exists between the source and the drain and corresponds to an area above the channel layer. A second distance exists between the source and the drain and corresponds to an area above the scan line. Here, the second distance is greater than the first distance, such that the source and the drain respectively have a deflection portion. The scan line and the deflection portions of the source and the drain are overlapped by about 0 um~about 1 um.

The invention further provides a TFT electrically connected to a scan line. The TFT includes a gate, a channel layer, a source, and a drain. The source and the drain extend away from the scan line. A first distance exists between the source and the drain and corresponds to an area above the channel layer. A second distance exists between the source and the drain and corresponds to an area above the scan line. Here, the second distance is greater than the first distance, such that the source and the drain respectively have a deflection portion. The deflection portions of the source and the drain have an extending direction. The scan line has an extending direction. Here, an acute angle ($\alpha$) is between the extending direction of the deflection portions of the source and the drain and the extending direction of the scan line.

The invention further provides a pixel structure including a data line, a first scan line, a first TFT, a second TFT, a second scan line, a third TFT, a main pixel electrode, and a sub-pixel electrode. The first TFT and the second TFT are disposed on the first scan line, and the first TFT and the second TFT are electrically connected to the first scan line and the data line. The first TFT has a first gate, a first channel layer, a first source, and a first drain. The second TFT has a second gate, a second channel layer, a second source, and a second drain. The first source is electrically connected to the data line, and the second drain is connected to the first source. The second scan line is parallel to the first scan line. The third TFT is disposed on the second scan line and electrically connected to the second scan line. The third TFT has a third gate, a third channel layer, a third source, and a third drain. The third source is connected to the second source. The main pixel electrode is electrically connected to the first drain of the first TFT. The sub-pixel electrode is electrically connected to the third source of the third TFT. Particularly, the third source and the third drain extend away from the second scan line. A first distance exists between the third source and the third drain and corresponds to an area above the third channel layer. A second distance exists between the third source and the third drain and corresponds to an area above the second scan line. Here, the second distance is greater than the first distance, such that the third source and the third drain respectively have a deflection portion. The second scan line and the deflection portions of the third source and the third drain are overlapped by about 0 um~about 1 um.

The invention further provides a pixel structure including a data line, a first scan line, a first TFT, a second TFT, a second scan line, a third TFT, a main pixel electrode, and a sub-pixel electrode. The first scan line is not parallel to the data line. The first TFT and the second TFT are disposed on the first scan line, and the first TFT and the second TFT are electrically connected to the first scan line and the data line. The first TFT has a first gate, a first channel layer, a first source, and a first drain. The second TFT has a second gate, a second channel layer, a second source, and a second drain. The first source is electrically connected to the data line, and the second drain is connected to the first source. The second scan line is parallel to the first scan line. The third TFT is disposed on the second scan line and electrically connected to the second scan line. The third TFT has a third gate, a third channel layer, a third source, and a third drain. The third source is connected to the second source. The main pixel electrode is electrically connected to the first drain of the first TFT. The sub-pixel electrode is electrically connected to the third source of the third TFT. Particularly, the third source and the third drain extend away from the second scan line. A first distance exists between the third source and the third drain and corresponds to an area above the third channel layer. A second distance exists between the third source and the third drain and corresponds to an area above the second scan line. Here, the second distance is greater than the first distance, such that the third source and the third drain respectively have a deflection portion. The deflection portions of the third source and the third drain have an extending direction. The second scan line has an extending direction. Here, an acute angle ($\alpha$) is between the extending direction of the deflection portions of the third source and the third drain and the extending direction of the second scan line.

In the invention as described above, the photo mask used for patterning the conductive layer is characterized in that the first width (W1) is between the source pattern and the drain pattern, and the data line pattern has a second width (W2). Here, the first width (W1) and the second width (W2) satisfy the following: if W1=1(um), then W2+a(um), and $0.3 < a < 0.7$. The photoresist patterns formed by using the photo mask serve as the etching mask for defining the source, the drain, and the data line, such that the source, the drain, and the data line can have uniform CD.

In addition, the second scan line and the deflection portions of the source and the drain are overlapped by about 0 um~about 1 um, or an acute angle ($\alpha$) is formed between the extending direction of the deflection portions of the source and the drain and the extending direction of the second scan line. Thereby, short circuit between the source and the drain can be precluded.

It is to be understood that both the foregoing general descriptions and the following detailed embodiments are exemplary and are, together with the accompanying drawings, intended to provide further explanation of technical features and advantages of the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

First Embodiment

Figure 2A:
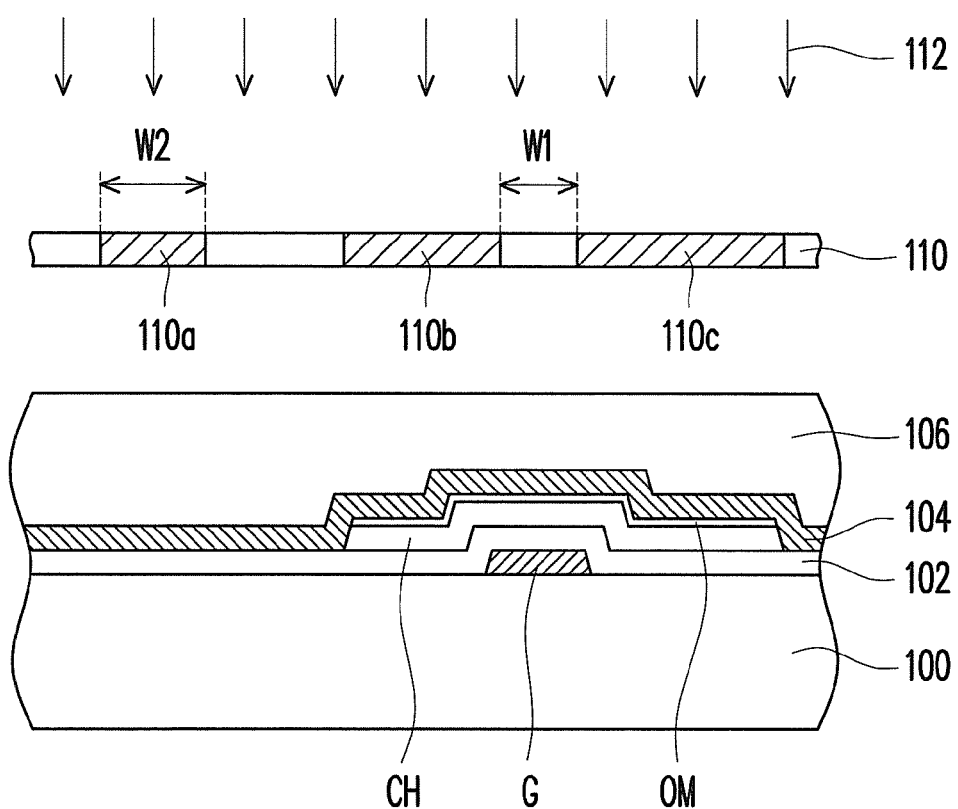
FIG. 2A to FIG. 2C are schematic cross-sectional views illustrating a process of fabricating a TFT according to an embodiment of the invention.
Figure 2B:
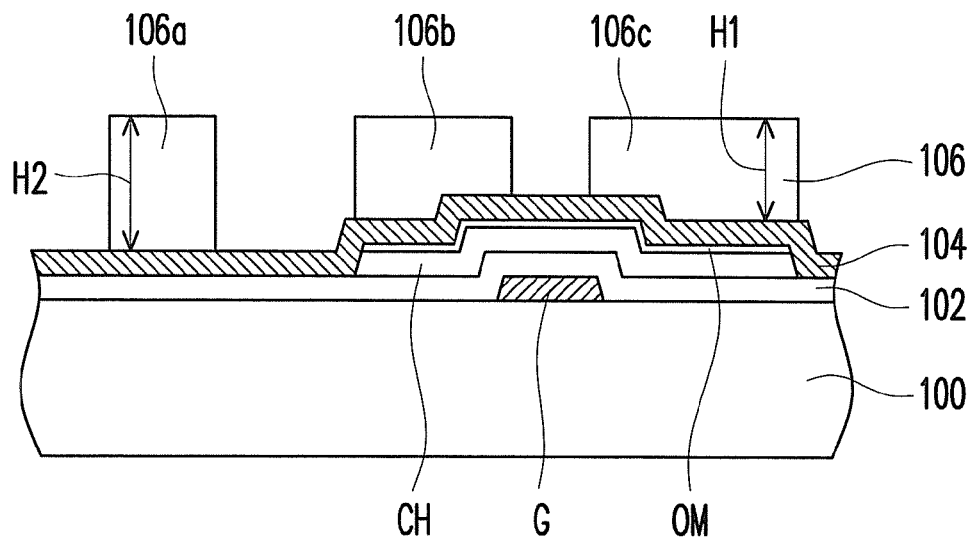
Figure 2C:
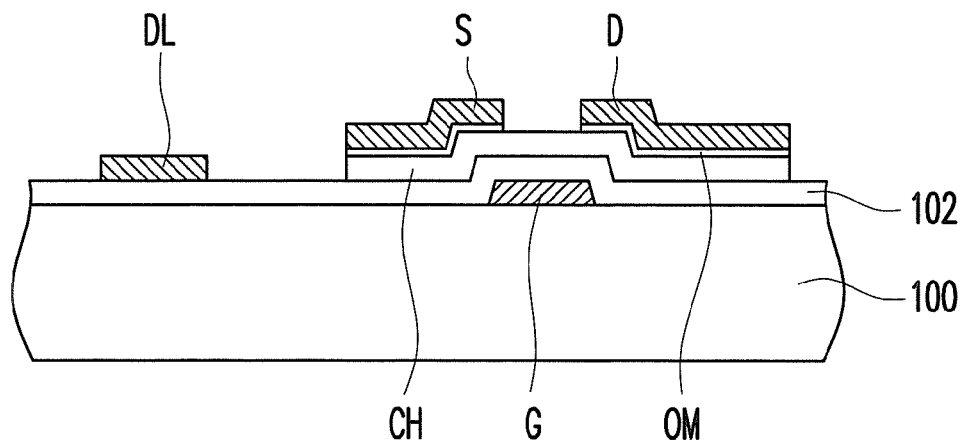

FIG. 2A to FIG. 2C are schematic cross-sectional views illustrating a process of fabricating a TFT according to an embodiment of the invention. With reference to FIG. 2A, in a method of fabricating the TFT according to this embodiment, a substrate 100 is provided, and a gate G, an insulating layer 102, and a channel layer CH are already formed on the substrate 100. According to an embodiment of the invention, an ohmic contact layer OM is further formed on the channel layer CH.

The substrate 100 can be made of glass, quartz, organic polymer, a non-light-transmissive/reflective material (such as a conductive material, wafer, ceramics, or the like), or other suitable materials.

The gate G is formed on the substrate 100. The gate G is formed by depositing a conductive material layer on the substrate 100 and patterning the conductive material layer by performing a photolithography and etching process, for instance. In consideration of conductivity, the gate G is typically made of a metal material. However, the invention is not limited herein. According to other embodiments of the invention, the gate G can be made of other conductive materials (such as an alloy, a metal nitride material, a metal oxide material, a metal oxynitride material, or other suitable materials) or a layer in which the metal material and other conductive materials are stacked together.

The insulating layer 102 is foamed on the substrate 100 and covers the gate G. Here, the insulating layer 102 can be referred to as the gate insulating layer. The insulating layer 102 is, for example, formed by performing a chemical vapor deposition process, a physical vapor deposition process, or other known deposition processes. A material of the insulating layer 102 includes silicon oxide, silicon nitride, silicon oxynitride, other appropriate materials, or a layer in which at least two of the aforesaid materials are stacked.

A material of the channel layer CH is, for example, amorphous silicon, polysilicon, metal oxide semiconductor, or other appropriate semiconductor materials. A material of the ohmic contact layer OM can be doped polysilicon or other materials capable of enhancing electrical contact between metal and silicon. According to an embodiment of the invention, the channel layer CH and the ohmic contact layer OM are formed by performing a deposition process (e.g., a chemical vapor deposition process, a physical vapor deposition process, or other known deposition processes) to sequentially deposit a channel material layer and an ohmic contact material layer and then patterning the channel material layer and the ohmic contact material layer.

A conductive layer 104 is formed on the substrate 100 to cover the channel layer CH and the insulating layer 102. The conductive layer 104 is, for example, formed by performing a chemical vapor deposition process, a physical vapor deposition process, or other known deposition processes. In this embodiment, the conductive layer 104 covers the ohmic contact layer OM and the insulating layer 102. A material of the conductive layer 104 can be a metal material, an alloy, a metal nitride material, a metal oxide material, a metal oxynitride material, other suitable materials, or a layer in which the metal material and other conductive materials are stacked together.

A photoresist layer 106 is formed on the conductive layer 104. The photoresist layer 106 is made of an organic photosensitive material, for instance.

A photo mask 110 is then placed above the photoresist layer 106. In particular, the photo mask 110 has a data line pattern 110a, a source pattern 110b, and a drain pattern 110c. A first width (W1) is between the source pattern 110b and the drain pattern 110c, and the data line pattern 110a has a second width (W2). The first width (W1) and the second width (W2) satisfy the following: if W1−1(um), then W2+a(um), and 0.3<a<0.7.

An exposing process 112 is then performed with use of the photo mask 110, and a development process is carried out, so as to pattern the photoresist layer 106 and form the structure shown in FIG. 2B. Specifically, after the photoresist layer 106 is patterned, the patterned photoresist layer has a photoresist pattern 106a corresponding to the data line pattern 110a of the photo mask 110, a photoresist pattern 106b corresponding to the source pattern 110b of the photo mask 110, and a photoresist pattern 106c corresponding to the drain pattern 110c of the photo mask 110. Energy of the exposing process 112 is approximately 23 mj/cm2~26 mj/cm$^2$.

Note that a thickness H2 of the photoresist layer 106 corresponding to the data line pattern 110a of the photo mask 110 (i.e., the photoresist pattern 106a) is greater than a thickness H1 of the photoresist layer 106 corresponding to the source pattern 110b (i.e., the photoresist pattern 106b) and the drain pattern 110c (i.e., the photoresist pattern 106c) of the photo mask 110. In an embodiment of the invention, the thickness H2 of the photoresist layer 106 corresponding to the data line pattern 110a of the photo mask 110 (i.e., the photoresist pattern 106a) differs from the thickness H1 of the photoresist layer 106 corresponding to the source pattern 110b (i.e., the photoresist pattern 106b) and the drain pattern 110c (i.e., the photoresist pattern 106c) of the photo mask 110 by about 4900 angstroms~about 6200 angstroms. Namely, the thickness H2 is greater than the thickness H1 by about 4900 angstroms~about 6200 angstroms.

Based on the above, as shown in FIG. 2A and FIG. 2B, the film layers that are located below the photoresist layer 106 and correspond to the data line pattern 110a of the photo mask 110 (i.e., the photoresist pattern 106a) have lower heights than heights of the film layers that are located below the photoresist layer 106 and correspond to the source pattern 110b (i.e., the photoresist pattern 106b) and the drain pattern 110c (i.e., the photoresist pattern 106c) of the photo mask 110. Therefore, the photoresist patterns 106a, 106b, 106c of the photoresist layer 106 have different thicknesses at said two different locations. Namely, the thickness H2 is greater than the thickness H1. Due to the different thicknesses H1 and H2 of the photoresist layer 106, the photoresist layer 106 at the two different locations is exposed to different extent during the exposing process 112. Thus, the CD of the patterned photoresist layer 106 may be affected. In the photo mask 110 of this embodiment, the first width (W1) between the source pattern 110b and the drain pattern 110c and the second width (W2) of the data line pattern 110a satisfy the following: if W1−1(um), then W2+a(um), and 0.3<a<0.7. As such, the CD of the photoresist layer 106 is not affected by the different heights of the film layers at said two different locations.

The conductive layer 104 is patterned with use of the photoresist layer 106 as an etching mask, so as to form the source S, the drain D, and the data line DL, as indicated in FIG. 2C. Here, the conductive layer 104 can be patterned by dry etching or wet etching.

Figure 3:
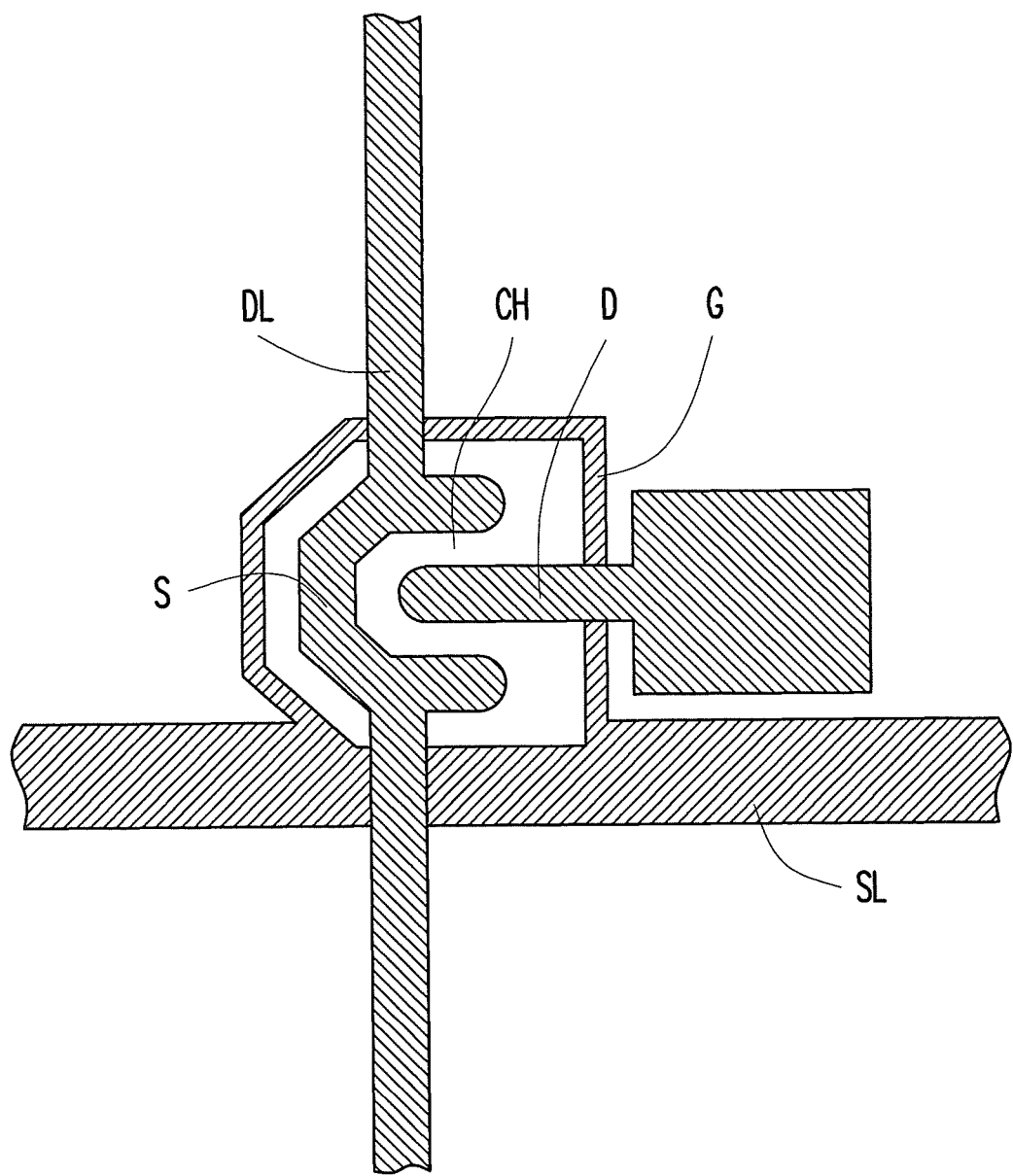
FIG. 3 is a schematic top view illustrating the TFT depicted in FIG. 2C.

FIG. 3 is a top view illustrating the TFT depicted in FIG. 2C, and the TFT includes the gate G, the channel layer CH, the source S, and the drain D. The source S is electrically connected to the data line DL, and the gate G is electrically connected to the scan line SL. Specifically, the distance between the source S and the drain D is approximately the same as the first width (W1) between the source pattern 110b and the drain pattern 110c of the photo mask 110 depicted in FIG. 2A, and the width of the data line DL is approximately the same as the second width (W2) of the data line pattern 110a of the photo mask 110 depicted in FIG. 2A. Hence, the distance (W1) between the source S and the drain D and the width (W2) of the data line DL also satisfy the following: if W1−1(um), then W2+a(um), and 0.3<a<0.7.

Second Embodiment

Figure 4:
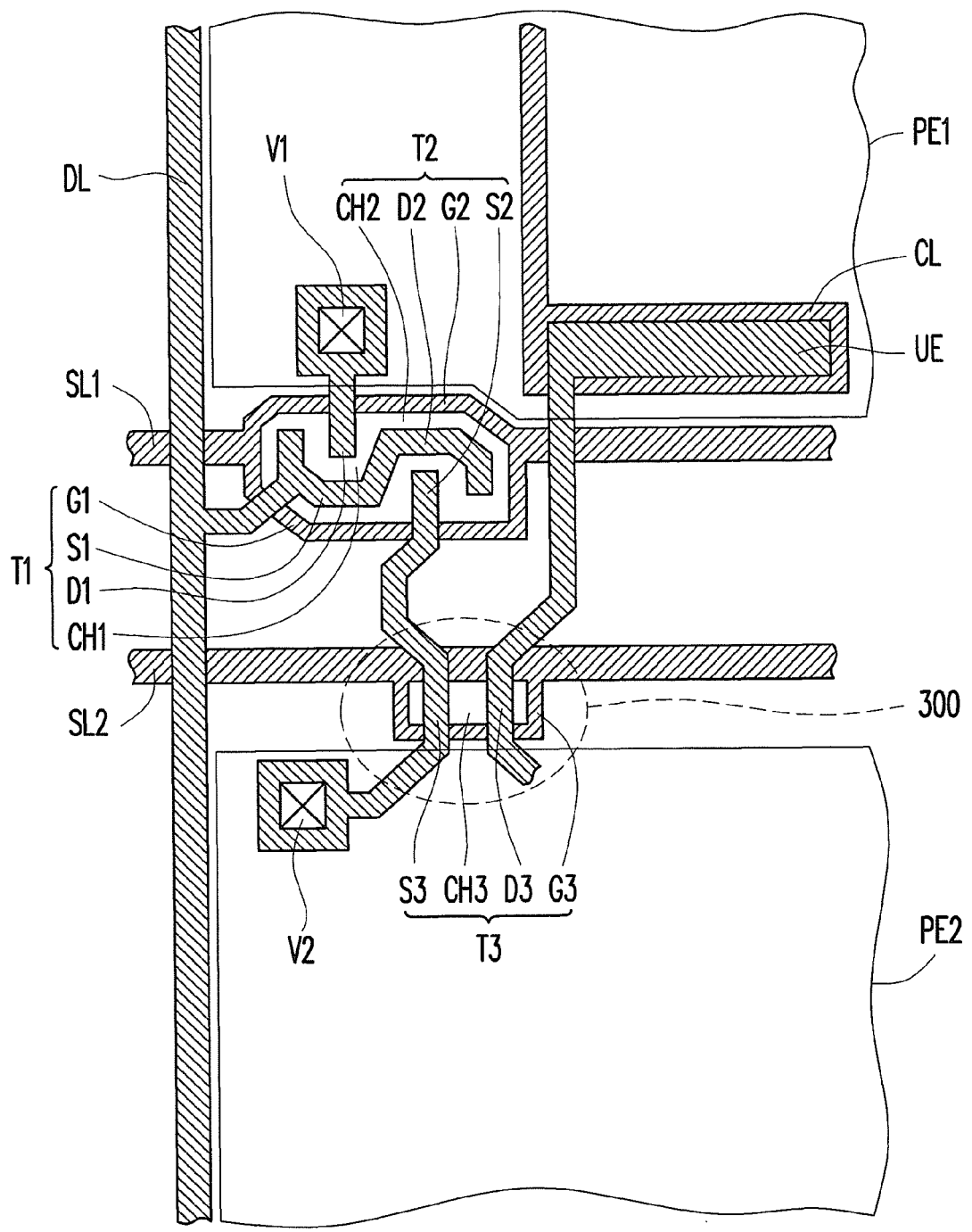
FIG. 4 is a schematic top view illustrating a pixel structure according to an embodiment of the invention.
Figure 5:
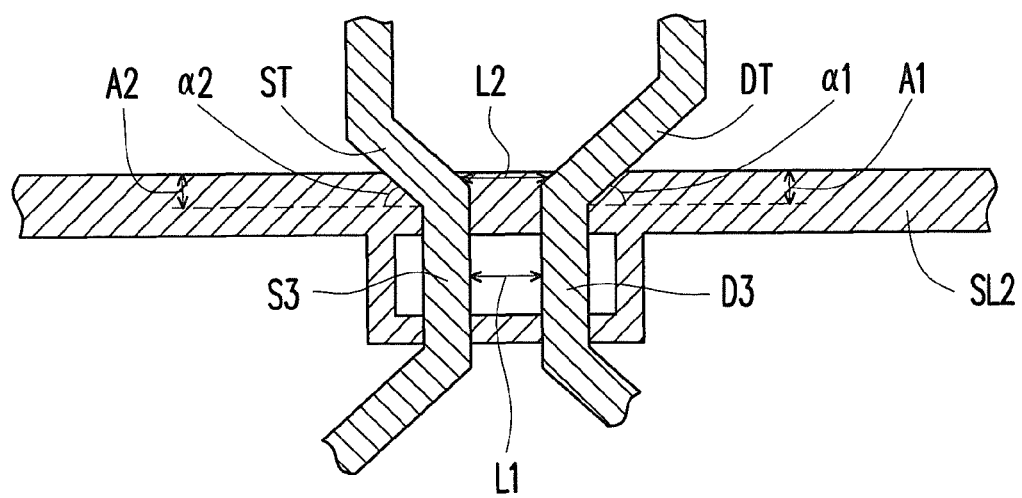
FIG. 5 is a schematic enlarged view of an area marked as "300" in FIG. 4.

FIG. 4 is a schematic top view illustrating a pixel structure according to an embodiment of the invention. FIG. 5 is a schematic enlarged view of an area marked as "300" in FIG. 4. With reference to FIG. 4 and FIG. 5, the pixel structure of this embodiment includes a data line DL, a first scan line SL1, a second scan line SL2, a first TFT T1, a second TFT T2, a third TFT T3, a main pixel electrode PE1, and a sub-pixel electrode PE2.

The first scan line SL1 and the second scan line SL2 are parallel. The data line DL and the first and second scan lines SL1 and SL2 are alternately arranged. An insulating layer is sandwiched between the data line DL and the first and second scan lines SL1 and SL2. In other words, an extending direction of the data line DL is not parallel to extending directions of the first and second scan lines SL1 and SL2. Preferably, the extending direction of the data line DL is perpendicular to the extending directions of the first and second scan lines SL1 and SL2. In addition, the first and second scan lines SL1 and SL2 and the data line DL are in different layers. In consideration of conductivity, the first and second scan lines SL1 and SL2 and the data line DL are usually made of a metal material. However, the invention is not limited thereto. According to other embodiments of the invention, the first and second scan lines SL1 and SL2 and the data line DL can also be made of any other conductive material. The conductive material is, for example, an alloy, a metal nitride material, a metal oxide material, a metal oxynitride material, other appropriate materials, or a layer in which the metal material and other conductive materials are stacked together.

The first TFT T1 is disposed on the first scan line SL1, and the first TFT T1 is electrically connected to the first scan line SL1 and the data line DL. The first TFT T1 has a first gate G1, a first channel layer CH1, a first source S1, and a first drain D1. Here, the first gate G1 is electrically connected to the first scan line SL1, and the first source S1 is electrically connected to the data line DL.

The second TFT T2 is disposed on the first scan line SL1, and the second TFT T2 is electrically connected to the first scan line SL1 and the data line DL. The second TFT T2 has a second gate G2, a second channel layer CH2, a second source S2, and a second drain D2. Here, the second gate G2 is electrically connected to the first scan line SL1, and the second drain D2 is connected to the first source S1. Hence, the second drain D2 is electrically connected to the data line DL. According to this embodiment, the first channel layer CH1 and the second channel layer CH2 are the same semiconductor pattern.

The third TFT T3 is disposed on and electrically connected to the second scan line SL2. The third TFT T3 has a third gate G3, a third channel layer CH3, a third source S3, and a third drain D3. Here, the third gate G3 is electrically connected to the second scan line SL2, and the third source S3 is connected to the second source S2.

In particular, the third source S3 and the third drain D3 in the third TFT T3 extend away from the second scan line SL2, as indicated in FIG. 5. A first distance L1 exists between the third source S3 and the third drain D3 and corresponds to an area above the third channel layer CH3. A second distance L2 exists between the third source S3 and the third drain D3 and corresponds to an area above the second scan line SL2. Here, the second distance L2 is greater than the first distance L1, such that the third source S3 has a deflection portion ST, and that the third drain D3 has a deflection portion DT. The second scan line SL2 and the deflection portion ST of the third source S3 are overlapped by a length A2 ranging from about 0 um to about 1 um (A2=0 um~1 um), and the second scan line SL2 and the deflection portion DT of the third drain D3 are overlapped by a length A1 ranging from about 0 um to about 1 um (A1=0 um~1 um). Preferably, the second scan line SL2 and the deflection portion ST of the third source S3 are overlapped by the length A2 ranging from about 0 um to about 0.5 um (A2=0 um~0.5 um), and the second scan line SL2 and the deflection portion DT of the third drain D3 are overlapped by the length A1 ranging from about 0 um to about 0.5 um (A1=0 um~0.5 um). Most favorably, the second scan line SL2 and the deflection portion ST of the third source S3 are overlapped by the length A2 ranging from about 0.59 um to about 0.77 um (A2=0.59 um~0.77 um), and the second scan line SL2 and the deflection portion DT of the third drain D3 are overlapped by the length A1 ranging from about 0.59 um to about 0.77 um (A1=0.59 um~0.77 um). The lengths A1 and A2 can be the same or different.

That is to say, in this embodiment, the third source S3 and the third drain D3 respectively have the deflection portions ST and DT, and therefore the third source S3 and the third drain D3 have the patterns diffusing in an outward manner and are gradually separated from each other. It is also likely for the second scan line SL2 to overlap (0<A1≤1 um, 0<A2≤1 um) or not to overlap (A1=0, A2=0) the deflection portion ST of the third source S3 and the deflection portion DT of the third drain D3.

Figure 1:
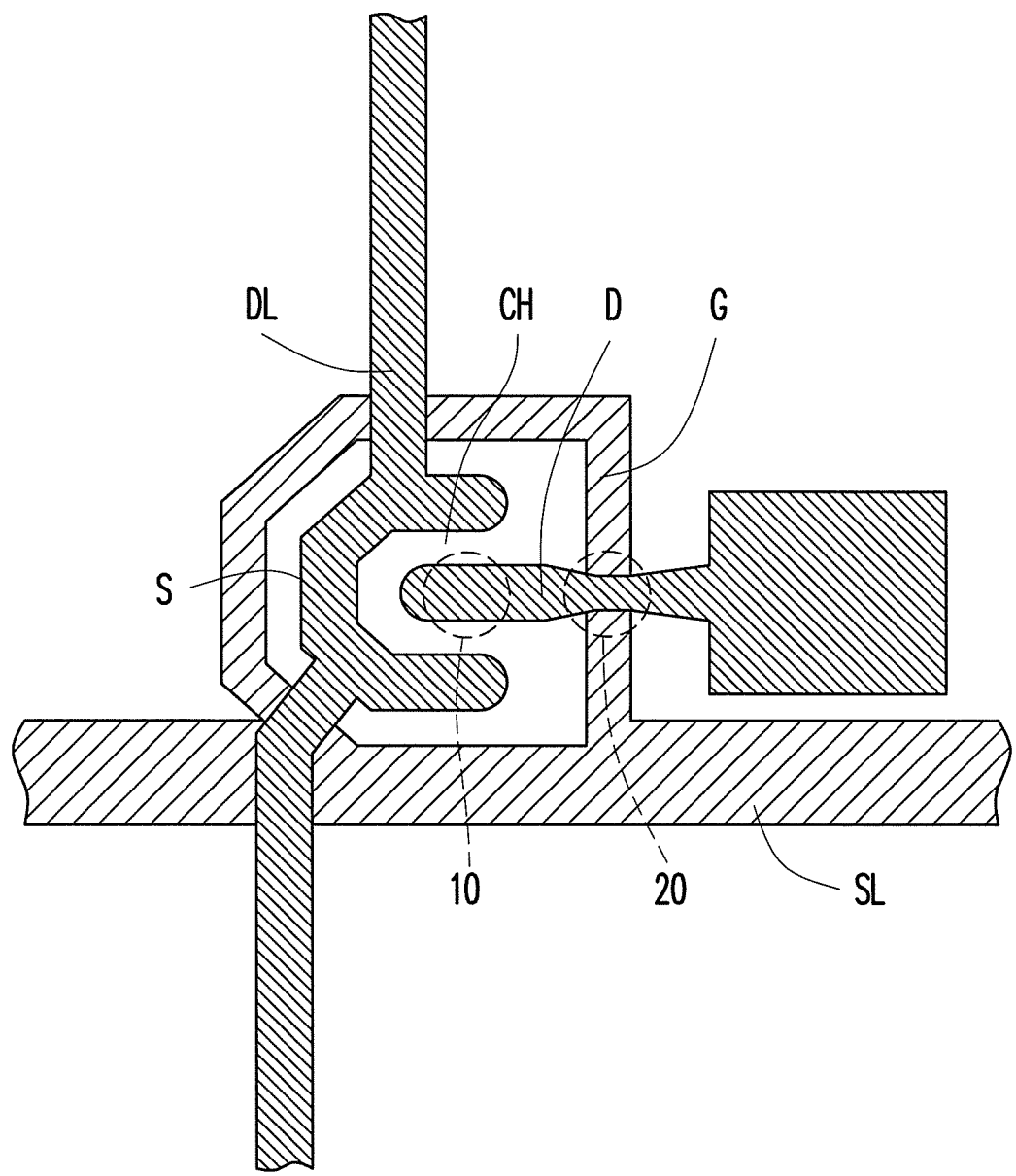
FIG. 1 is a schematic top view illustrating a conventional TFT.

Note that the film layers at the overlapping area and the non-overlapping area of the third source S3, the third drain D3, and the second scan line SL2 have different heights. The invention aims at preventing broken lines or short circuit caused by non-uniform CD at the overlapping area and at the non-overlapping area of the third source S3, the third drain D3, and the second scan line SL2. In other words, the CD of the photoresist layer may deviate from the original design during the exposing process because the film layers below the drain D have different heights, as indicated in FIG. 1. To resolve said issues, the third source S3 and the third drain D3 are specially designed in this embodiment as discussed above. Thereby, short circuit does not occur between the third source S3 and the third D3, and broken line of the third source S3 and broken line of the third drain D3 can be prevented.

According to another embodiment of the invention, in the third TFT T3, as shown in FIG. 5, an acute angle a2 is formed between an extending direction of the deflection portion ST of the third source S3 and an extending direction of the second scan line SL2. An acute angle a1 is formed between an extending direction of the deflection portion DT of the third drain D3 and the extending direction of the second scan line SL2. Preferably, $0°<\alpha 1 \leq 45°$, and $0<\alpha 2 \leq 45°$. In addition, the acute angles $\alpha 1$ and $\alpha 2$ can be the same or different.

Namely, in this embodiment, the acute angle $\alpha 2$ is formed between the extending direction of the deflection portion ST of the third source S3 and the extending direction of the second scan line SL2, and the acute angle $\alpha 1$ is formed between the extending direction of the deflection portion DT of the third drain D3 and the extending direction of the second scan line SL2. Accordingly, the third source S3 and the third drain D3 have the patterns diffusing in an outward manner and are gradually separated from each other. To prevent short circuit that is caused by non-uniform CD at the overlapping area and at the non-overlapping area of the third source S3, the third drain D3, and the second scan line SL2 occurs between the third source S3 and the third drain D3, the design of the third source S3 and the third drain D3 is modified in the invention, as discussed above.

According to another embodiment of the invention, in the third TFT T3, as shown in FIG. 5, the deflection portion ST of the third source S3 and the second scan line SL2 are overlapped by the length A2 ranging from about 0 um to about 1 um (A2=0 um~1 um), and the deflection portion DT of the third drain D3 and the second scan line SL2 are overlapped by the length A1 ranging from about 0 um to about 1 um (A1=0 um~1 um). In addition, the acute angle $\alpha 2$ is formed between the extending direction of the deflection portion ST of the third source S3 and the extending direction of the second scan line SL2, and the acute angle $\alpha 1$ is formed between the extending direction of the deflection portion DT of the third drain D3 and the extending direction of the second scan line SL2.

With reference to FIG. 4 again, in this pixel structure, the main pixel electrode PE1 is electrically connected to the first drain D1 of the first TFT T1. According to this embodiment, the main pixel electrode PE1 is electrically connected to the first drain D1 of the first TFT T1 through a contact via V1. Alignment patterns (alignment slits or alignment protrusions) can be further formed in the main pixel electrode PE1. The sub-pixel electrode PE2 is electrically connected to the third source S3 of the third TFT T3. According to this embodiment, the sub-pixel electrode PE2 is electrically connected to the third source S3 of the third TFT T3 through a contact via V2. Alignment patterns (alignment slits or alignment protrusions) can be further formed in the sub-pixel electrode PE2. The main pixel electrode PE1 and the sub-pixel electrode PE2 can be transparent electrode layers, reflective electrode layers, or transflective electrode layers.

Additionally, in the pixel structure of the embodiment, a capacitor electrode CL and an upper electrode UE can be further disposed to form a capacitor of the pixel structure.

In the previous embodiment depicted in FIG. 4 and FIG. 5, the design of the third source S3 and the third drain D3 of the third TFT T3 (i.e., the design of the lengths A1 and A2 and the acute angles $\alpha 1$ and $\alpha 2$) can be fulfilled by the photo mask that defines the third source S3 and the third drain D3. In other words, the third source S3 and the third drain D3 are often formed by forming a conductive layer and forming a photoresist layer on the conductive layer. The photoresist layer is then patterned with use of the photo mask, and the conductive layer is patterned with use of the patterned photoresist layer as the etching mask, so as to form the third source S3 and the third drain D3. As stated above, the third source pattern and the third drain pattern (i.e. the patterns that define the third source S3 and the third drain D3) in the photo mask can have the design of the lengths A1 and A2 and the acute angles α1 and α2. As such, the third source S3 and the third drain D3 formed by performing the patterning process with use of the photo mask can have the features of the lengths A1 and A2 and the acute angles α1 and α2.

It will be apparent to those skilled in the art that various modifications and variations can be made to the structure of the present invention without departing from the scope or spirit of the invention. In view of the foregoing, it is intended that the invention cover modifications and variations of the invention provided they fall within the scope of the following claims and their equivalents.

What is claimed is:

1. A pixel structure comprising:
a data line;
a first scan line not parallel to the data line;
a first thin film transistor and a second thin film transistor, the first and second thin film transistors being disposed on the first scan line and electrically connected to the first scan line and the data line, the first thin film transistor having a first gate, a first channel layer, a first source, and a first drain, the second thin film transistor having a second gate, a second channel layer, a second source, and a second drain, wherein the first source is electrically connected to the data line, and the second drain is connected to the first source;
a second scan line parallel to the first scan line;
a third thin film transistor disposed on the second scan line and electrically connected to the second scan line, the third thin film transistor having a third gate, a third channel layer, a third source, and a third drain, the third source being connected to the second source;
a main pixel electrode electrically connected to the first drain of the first thin film transistor;
a sub-pixel electrode electrically connected to the third source of the third thin film transistor,
wherein each of the third source and the third drain has a linear portion, a first deflection portion and a second deflection portion formed integrally, the linear portion connected between the first deflection portion and the second deflection portion is arranged across the third channel layer, a connection of each first deflection portion connected to an end of the linear portion is arranged between the edge of the second scan line and the third channel layer, and a connection of each second deflection portion connected to another end of the linear portion is arranged between the edge of the second scan line and the third channel layer, such that a first distance exists between the linear portions of the third source and the third drain, a second distance exists between the first deflection portions of the third source and the third drain, a third distance exists between the second deflection portions of the third source and the third drain, and the second distance and the third distance are greater than the first distance and the second scan line and the first deflection portions of the third source and the third drain being overlapped by about 0 um~about 1 um.

2. The pixel structure as claimed in claim 1, wherein the second scan line and the first deflection portions of the third source and the third drain are overlapped by about 0 um~about 0.5 um.

3. The pixel structure as claimed in claim 1, wherein an acute angle (α) is between a first extending direction of the first deflection portions of the third source and the third drain and a second extending direction of the second scan line.

4. The pixel structure as claimed in claim 3, wherein $0°<α≤45°$.

5. A pixel structure comprising:
a data line;
a first scan line not parallel to the data line;
a first thin film transistor and a second thin film transistor, the first and second thin film transistors being disposed on the first scan line and electrically connected to the first scan line and the data line, the first thin film transistor having a first gate, a first channel layer, a first source, and a first drain, the second thin film transistor having a second gate, a second channel layer, a second source, and a second drain, wherein the first source is electrically connected to the data line, and the second drain is connected to the first source;
a second scan line parallel to the first scan line;
a third thin film transistor disposed on the second scan line and electrically connected to the second scan line, the third thin film transistor having a third gate, a third channel layer, a third source, and a third drain, the third source being connected to the second source;
a main pixel electrode electrically connected to the first drain of the first thin film transistor;
a sub-pixel electrode electrically connected to the third source of the third thin film transistor,
wherein each of the third source and the third drain has a linear portion, a first deflection portion and a second deflection portion fondled integrally, the linear portion connected between the first deflection portion and the second deflection portion is arranged across the third channel layer, a connection of each first deflection portion connected to an end of the linear portion is arranged between the edge of the second scan line and the third channel layer, and a connection of each second deflection portion connected to another end of the linear portion is arranged between the edge of the second scan line and the third channel layer, such that a first distance exists between the linear portions of the third source and the third drain, a second distance exists between the first deflection portions of the third source and the third drain, a third distance exists between the second deflection portions of the third source and the third drain, and the second distance and the third distance are greater than the first distance, and an acute angle (α) exists between a first extending direction of the first deflection portions of the third source and the third drain and a second extending direction of the second scan line.

6. The pixel structure as claimed in claim 5, wherein $0°<α≤45°$.

* * * * *